United States Patent [19]
Tabota et al.

[11] Patent Number: 5,991,988
[45] Date of Patent: Nov. 30, 1999

[54] METHOD OF MANUFACTURING A PIEZOELECTRIC ELEMENT

[75] Inventors: Jun Tabota; Toshihiko Unami, both of Toyama-ken; Jiro Inoue, Toyama, all of Japan

[73] Assignee: Murata Manufacturing Co., Ltd., Japan

[21] Appl. No.: 08/754,839

[22] Filed: Nov. 22, 1996

Related U.S. Application Data

[62] Division of application No. 08/460,660, Jun. 2, 1995, Pat. No. 5,914,556.

[30] Foreign Application Priority Data

Sep. 9, 1994 [JP] Japan .................................... 6-215881
Dec. 12, 1994 [JP] Japan .................................... 6-307442

[51] Int. Cl.⁶ .................................................. H01L 41/22
[52] U.S. Cl. ........................... 29/25.35; 264/22; 310/328
[58] Field of Search .............................. 29/25.35; 264/22; 310/328, 357–359, 366

[56] References Cited

U.S. PATENT DOCUMENTS

5,400,488 3/1995 Ohno et al. ............................ 29/25.35

*Primary Examiner*—Carl E. Hall
*Attorney, Agent, or Firm*—Ostrolenk, Faber, Gerb & Soffen, LLP

[57] ABSTRACT

In a piezoelectric element (21), an internal electrode (31) is embedded in a piezoelectric ceramic body (22) to extend in its longitudinal direction, first to third surface electrodes (23 to 25, 27 to 29) are formed on upper and lower surfaces of the piezoelectric ceramic body (22) in first to third portions along the longitudinal direction, connecting electrodes (26, 30) are formed to connect the first to third surface electrodes (23 to 25, 27 to 29) with each other, the first to third portions are so polarized that the second portion is oppositely polarized to the first to third portions, and regions located above and under the internal electrode are polarized in opposite directions in the respective ones of the first to third portions.

9 Claims, 9 Drawing Sheets

METHOD OF MANUFACTURING A PIEZOELECTRIC ELEMENT

This is a division of application Ser. No. 08/460,660, filed Jun. 2, 1995, now U.S. Pat. No. 5,914,556.

BACKGROUND OF THE INVENTION

1. Field of the Invention

The present invention relates to a piezoelectric element and a method of manufacturing the same, and more particularly, it relates to a bimorph piezoelectric element which is suitably employed for forming an acceleration sensor and a method of manufacturing the same.

2. Description of the Background Art

In general, a sensor utilizing a piezoelectric element is known as an acceleration sensor which is employed for detecting impact or the like. With reference to FIG. 1, an exemplary piezoelectric element 1 of this type is now described.

The piezoelectric element 1 has a plate type piezoelectric ceramic body 2. First to third surface electrodes 3 to 5 are formed on an upper surface of the piezoelectric ceramic body 2 by a thin film forming method such as sputtering, at longitudinal intervals along the piezoelectric ceramic body 2. Further, a first connecting electrode 6 is formed on the upper surface of the piezoelectric ceramic body 2, for electrically connecting the first to third surface electrodes 3 to 5 with each other. A first signal drawing electrode is formed by the first to third surface electrodes 3 to 5 and the first connecting electrode 6.

On the other hand, first to third surface electrodes 7 to 9 are formed on a lower surface of the piezoelectric ceramic body 2 in first to third portions thereof respectively by a thin film forming method, and a second connecting electrode 10 is formed to at least partially cover the first to third surface electrodes 7 to 9, for electrically connecting the same with each other. A second signal drawing electrode is formed by the first to third surface electrodes 7 to 9 and the second connecting electrode 10.

The piezoelectric ceramic body 2 has a longitudinally extending internal electrode 11 in an intermediate vertical position. As shown in FIG. 1, the internal electrode 11 is formed not to reach both longitudinal ends of the piezoelectric ceramic body 2.

The interior of the piezoelectric ceramic body 2 is polarized as follows: In a piezoelectric ceramic body region 2A which is located above the portion provided with the internal electrode 11, the second portion is downwardly polarized as shown by arrow B while the first and third portions are upwardly polarized as shown by arrows A and C respectively. In a piezoelectric ceramic body region 2B which is located under the internal electrode 11, on the other hand, the first to third portions are polarized oppositely to those of the piezoelectric ceramic body region 2A which is located above the internal electrode 11, as shown by arrows D, E and F respectively. In other words, the upper and lower piezoelectric ceramic body regions 2A and 2B are polarized in opposite directions in each of the first to third portions. In each of the respective piezoelectric ceramic body regions 2A and 2B, the second portion and the first and third portions are polarized in opposite directions.

On the upper surface of the piezoelectric ceramic body 2, the first surface electrode 3 is formed to reach a side edge of the piezoelectric ceramic body 2, whereby an end of the first signal drawing electrode which is formed on the upper surface reaches this side surface of the piezoelectric ceramic body 2. On the lower surface of the piezoelectric ceramic body 2, on the other hand, the third surface electrode 9 is also formed to reach another side edge of the piezoelectric ceramic body 2, whereby the second signal drawing electrode which is formed on the lower surface reaches this side edge of the piezoelectric ceramic body 2.

Broken lines G and H show the boundaries between the first to third portions of the piezoelectric ceramic body 2 respectively. The first, second and third portions are located on the left side of the boundary G, between the boundaries G and H, and on the right side of the boundary H respectively.

The piezoelectric ceramic body 2 is held by frame bodies 12 and 13 which are arranged on upper and lower portions thereof respectively. Each of the frame bodies 12 and 13 is made of insulating ceramics such as alumina or another material having rigidity, and has a flat plate portion and a pair of fixed portions extending toward the piezoelectric ceramic body 2 from both ends of the flat plate portion. The frame body 12 is fixed to the upper surface of the piezoelectric ceramic body 2 at forward ends of the pair of fixed portions. Similarly, the frame body 13 is fixed to the lower surface of the piezoelectric ceramic body 2 at forward ends of the pair of fixed portions.

The piezoelectric element 1 has such a structure that the frame bodies 12 and 13 are fixed to the upper and lower portions of the piezoelectric ceramic body 2. External electrodes 14 and 15 are formed on both side surfaces of this structure. The external electrode 14 is electrically connected to the signal drawing electrode which is formed on the upper surface of the piezoelectric body 2, i.e., the first surface electrode 3, in more concrete terms. On the other hand, the external electrode 15 is electrically connected to the signal drawing electrode which is formed on the lower surface of the piezoelectric ceramic body 2, i.e., the third surface electrode 9, in more concrete terms.

When this piezoelectric element 1 is employed as an acceleration sensor, the following action is attained: When acceleration acts on the piezoelectric element 1, respective central portions of the piezoelectric ceramic body regions 2A and 2B forming the piezoelectric ceramic body 2, i.e., the second portions, and the first and third portions are deformed in opposite directions by action of inertial force. In this case, the second portions and the first and third portions are subjected to tensile force or compressive stress resulting from the aforementioned deformation. When the central second portions are subjected to tensile stress, for example, the first and third portions are subjected to compressive stress. On the other hand, the second portions and the first and third portions are polarized in opposite directions. Therefore, the quantity of electric charges generated in the overall piezoelectric ceramic body 2 is extremely increased due to contribution by those of electric charges generated by the stress in the second portions and the first and third portions. Thus, it is possible to form an acceleration sensor having excellent detection sensitivity.

A method of manufacturing the piezoelectric element 1 shown in FIG. 1 is now described with reference to FIGS. 2A to 2C and 3A and 3B. This method is adapted to obtain the piezoelectric element 1 shown in FIG. 1 from a mother piezoelectric ceramic body material, and hence ranges corresponding to individual piezoelectric elements are divided by phantom lines X, Y and Z in FIGS. 2A to 2C and 3A and 3B.

First, a mother piezoelectric ceramic body 16 which is in the form of an elongated plate is prepared as shown in FIG.

2A. Internal electrodes 11 are formed in the piezoelectric ceramic body 16 on its intermediate vertical position, to extend in the longitudinal direction. While a plurality of internal electrodes 11 are formed in FIG. 2A, each internal electrode 11 is provided in the finally obtained piezoelectric element 1 shown in FIG. 1.

The mother piezoelectric ceramic body 16 is divided into upper and lower piezoelectric ceramic body regions 16A and 16B through the portion provided with the aforementioned internal electrodes 11.

On an upper surface of the piezoelectric ceramic body 16, a plurality of sets of first to third surface electrodes 3 to 5 are formed longitudinally along the piezoelectric ceramic body 16.

On a lower surface of the piezoelectric ceramic body 16, a plurality of sets of first to third surface electrodes 7 to 9 are similarly formed along the longitudinal direction. The first to third surface electrodes 3 to 5 and 7 to 9 are formed to be positioned in the aforementioned first to third portions respectively.

Then, polarization is carried out through the internal electrodes 11 and the first to third surface electrodes 3 to 5 and 7 to 9. Namely, relatively high voltages, relatively low voltages, and intermediate voltages are applied to the second surface electrodes 4 and 8, the first and third surface electrodes 3, 5, 7 and 9, and the internal electrodes 11 respectively, thereby polarizing the respective piezoelectric ceramic body regions 16A and 16B as shown by arrows A to C and D to F in FIG. 2B.

Then, first and second connecting electrodes 6 and 10 are stacked/formed on the first to third surface electrodes 3 to 5 and 7 to 9 respectively in the individual piezoelectric element portions, as shown in FIG. 2C.

Then, mother frame bodies 17 and 18 are pasted to and integrated with upper and lower portions of the piezoelectric ceramic body 16 respectively by adhesives, as shown in FIG. 3A. Further, the structure shown in FIG. 3A is cut along two-dot chain lines X, Y and Z to obtain individual piezoelectric elements 1, thereby obtaining a structural body 19 shown in FIG. 3B. The signal drawing electrode which is formed on the upper surface of the piezoelectric ceramic body 2, i.e., the first surface electrode 3 in more concrete terms, is exposed on one side surface of the structural body 19 obtained in the aforementioned manner. Similarly, an end of another signal drawing electrode, i.e., the third surface electrode 9 in more concrete terms, is exposed on another side surface of the piezoelectric ceramic body 2. The external electrodes 14 and 15 shown in FIG. 1 are formed on these side surfaces, so that the respective signal drawing electrodes are electrically connected with the external electrodes 14 and 15 for obtaining the piezoelectric element 1.

However, the aforementioned method of manufacturing the piezoelectric element 1 has the following problems: The thicknesses of the first to third mother surface electrodes 3 to 5 and 7 to 9 which are formed on the upper and lower surfaces of the mother piezoelectric ceramic body 16 may be reduced depending on the forming conditions. When the thicknesses of the surface electrodes 3 to 5 and 7 to 9 are reduced, electrical connection between the external electrodes 14 and 15 and the surface electrodes 3 and 9, i.e., electrical connection between the external electrodes 14 and 15 and the respective signal drawing electrodes, may be instabilized.

When the connecting electrodes 6 and 10 are formed by a method of screen-printing conductive paste and baking the same, further, depolarization is caused in the piezoelectric ceramic body 16 by heat which is applied in baking. When slight depolarization is caused, detection sensitivity is reduced in the obtained acceleration sensor. Thus, the non-defective rate as well as mass productivity of the acceleration sensor are disadvantageously reduced.

SUMMARY OF THE INVENTION

In order to solve the aforementioned problems of the piezoelectric element and the method of manufacturing the same, an object of the present invention is to provide a piezoelectric element which can stabilize an electrical connection state between a signal drawing electrode provided thereon and an external electrode while hardly causing depolarization in a piezoelectric ceramic body, and a method of manufacturing the piezoelectric element.

According to a wide aspect of the present invention, provided is a piezoelectric element comprising a piezoelectric body having first to third portions along its longitudinal direction so that the first and third portions and the second portion are oppositely polarized along its thickness direction, an internal electrode which is formed in the interior of the piezoelectric body to extend in the longitudinal direction but not to reach both longitudinal ends, and first and second signal drawing electrodes which are formed on upper and lower surfaces of the piezoelectric body respectively. The first and second signal drawing electrodes have first to third surface electrodes consisting of thick films which are formed on the first to third portions respectively to be separated from each other along the longitudinal direction, and connecting electrodes consisting of thin films which are formed to electrically connect the first to third surface electrodes with each other while at least partially covering the first to third surface electrodes.

The connecting electrodes can be formed not to reach both longitudinal ends of the piezoelectric body. The piezoelectric body is preferably made of piezoelectric ceramics.

According to a certain specific aspect of the present invention, the aforementioned piezoelectric element can be manufactured through steps of preparing a plate type piezoelectric body which is provided therein with an internal electrode to extend along its longitudinal direction, applying conductive paste to upper and lower surfaces of the piezoelectric body in first to third portions of the piezoelectric body along the longitudinal direction and baking the same thereby forming first to third surface electrodes respectively, polarizing the piezoelectric body through the internal electrode and the first to third surface electrodes provided on the upper and lower surfaces of the piezoelectric body respectively so that the first and third portions and the second portion of the piezoelectric body are oppositely polarized in its thickness direction, and forming first and second connecting electrodes for electrically connecting the first to third surface electrodes which are formed on the upper and lower surfaces of the piezoelectric body respectively with each other by sputtering, to at least partially cover the first to third surface electrodes respectively. In this case, the step of preparing the plate type piezoelectric body provided with the internal electrode is carried out by pasting a pair of piezoelectric ceramic plates to each other through interposition of the internal electrode therebetween, for example.

According to another specific aspect of the present invention, the aforementioned piezoelectric element can be manufactured through steps of preparing a pair of piezoelectric ceramic plates, forming internal electrodes on single major surfaces of the respective piezoelectric ceramic plates to extend in longitudinal directions thereof but not to reach both longitudinal ends, forming first to third surface electrodes consisting of thick films in first to third portions along the longitudinal directions on surfaces of the piezoelectric ceramic plates which are opposite to those provided with the internal electrodes by application and baking of conductive paste respectively, polarizing the respective piezoelectric ceramic plates provided with the internal electrodes and the first to third surface electrodes so that the first and third portions and the second portions are oppositely polarized along thickness directions through the internal electrodes and the first to third surface electrodes, forming connecting electrodes consisting of thin films by sputtering on the surfaces of the respective piezoelectric ceramic plates provided with the first to third surface electrodes for electrically connecting the first to third surface electrodes with each other while at least partially covering the same, and pasting the surfaces, provided with the internal electrodes, of the pair of piezoelectric ceramic plates provided with the connecting electrodes with each other for forming a piezoelectric body.

In the piezoelectric element according to the wide aspect of the present invention and the method of manufacturing the same, the first to third surface electrodes defining the signal drawing electrodes are formed as thin films. Therefore, it is possible to stabilize electrical connection states of the surface electrodes and external electrodes which are formed on outer surfaces of the piezoelectric element. Further, the connecting electrodes are formed as thin films for electrically connecting the first to third surface electrodes with each other while at least partially covering the first to third surface electrodes by sputtering, whereby no depolarization of the piezoelectric body is caused in formation of the electrodes. Namely, the temperature of the piezoelectric body is suppressed below a Curie point in formation of the electrodes by sputtering, whereby the piezoelectric body is hardly depolarized. In an acceleration sensor which is formed by the inventive piezoelectric element, therefore, it is possible to improve detection sensitivity as well as mass productivity of the acceleration sensor.

According to a second wide aspect of the present invention, provided is a piezoelectric element comprising a piezoelectric body, having first to third portions along its longitudinal direction, which is so polarized that the first and third portions and the second portion are oppositely polarized in its thickness direction, first to third internal electrodes which are formed in the piezoelectric body to longitudinally extend in the first to third portions respectively while being separated from each other, and first and second signal drawing electrodes which are formed on upper and lower surfaces of the piezoelectric body respectively.

In this case, the piezoelectric body is preferably made of piezoelectric ceramics.

The piezoelectric element can be manufactured by the following first or second method, for example.

The first method comprises steps of preparing first and second rectangular plate type green sheets containing piezoelectric ceramics, applying conductive paste to first to third portions of the first green sheet along its longitudinal direction on one surface thereof for forming first to third internal electrode patterns respectively, stacking the second green sheet on the surface of the first green sheet provided with the first to third internal electrode patterns for obtaining a laminate sheet, firing the laminate sheet thereby integrally firing the ceramics and the first to third internal electrodes for obtaining a sintered body, applying conductive paste to upper and lower surfaces of the sintered body and baking the same thereby forming first and second signal drawing electrodes respectively, and polarizing the sintered body through the first and second signal drawing electrodes and the first to third internal electrodes so that the first and third portions and the second portion along the longitudinal direction of the sintered body are oppositely polarized in its thickness direction.

On the other hand, the second method comprises the steps of preparing first and second piezoelectric ceramic plates in the form of fired rectangular plates, applying conductive paste to first to third portions along longitudinal directions on single surfaces of the first and second piezoelectric ceramic plates respectively for forming first to third internal electrode patterns, applying conductive paste to surfaces of the first and second piezoelectric ceramic plates opposite to those provided with the internal electrode patterns for forming first and second signal drawing electrode patterns respectively, heating the first and second piezoelectric ceramic plates thereby baking the internal electrode patterns and the signal drawing electrode patterns for forming first to third internal electrodes and signal drawing electrodes, polarizing the first and second piezoelectric ceramic plates through the signal drawing electrodes and the first to third internal electrodes so that the first and third portions and the second portions of the piezoelectric ceramic plates are oppositely polarized in thickness directions thereof, and bonding the surfaces, provided with the internal electrodes, of the first and second piezoelectric ceramic plates provided with the first to third internal electrodes to each other thereby obtaining a piezoelectric element.

The piezoelectric element according to the present invention is suitably applied to an acceleration sensor, for example. According to the present invention, therefore, an acceleration sensor employing the aforementioned piezoelectric element is provided.

In the piezoelectric element according to the second wide aspect of the present invention and the method of manufacturing the same, the first to third internal electrodes are formed in the piezoelectric body and the first and second signal drawing electrodes are arranged on outer surfaces, while the first to third portions are polarized through the first to third internal electrodes and the signal drawing electrodes. Therefore, it is not necessary to form a plurality of surface electrodes which are separated from each other on the upper and lower surfaces of the piezoelectric body, and to execute polarization through such separated first to third surface electrodes. Further, it is not necessary to form connecting electrodes after completion of polarization, and hence it is not necessary to bring the signal drawing electrodes into two-layer structures either. Consequently, the step of forming the electrodes on the upper and lower surfaces of the piezoelectric body can be simplified. While depolarization may result from heating when signal drawing electrodes of two-layer structures are formed by baking conductive paste, further, such depolarization is not caused in the piezoelectric element according to the second wide aspect of the present invention and the method of manufacturing the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
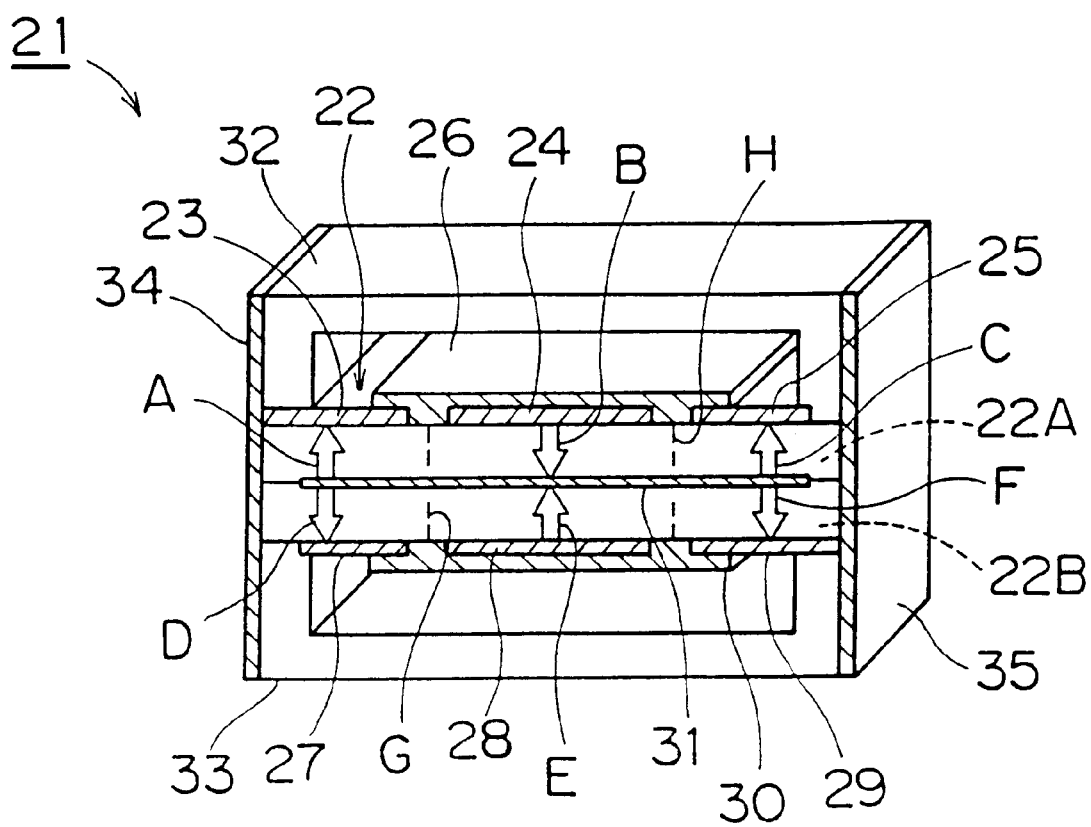
FIG. 4 is a perspective view showing a piezoelectric element according to a first embodiment of the present invention.

FIG. 4 is a perspective view for illustrating a piezoelectric element 21 according to a first embodiment of the present invention.

The piezoelectric element 21 is formed by a rectangular plate type piezoelectric ceramic body 22. First to third surface electrodes 23, 24 and 25 are formed on an upper surface of the piezoelectric ceramic body 2. The first to third surface electrodes 23 to 25 are formed in positions similar to those of the first to third surface electrodes 3 to 5 of the conventional piezoelectric element 1 shown in FIG. 1. On a lower surface of the piezoelectric body 22, further, first to third surface electrodes 27 to 29 are formed to be separated from each other. The first to third surface electrodes 27 to 29 are formed in positions similar to those of the first to third surface electrodes 7 to 9 of the conventional piezoelectric element 1 shown in FIG. 1. According to this embodiment, all of the first to third surface electrodes 23 to 25 and 27 to 29 are formed as thick films by applying and baking conductive paste. In this point, the first to third surface electrodes 23 to 25 and 27 to 29 are different from the surface electrodes 3 to 5 and 7 to 9 shown in FIG. 1.

According to this embodiment, further, a connecting electrode 26 is formed on the upper surface of the piezoelectric ceramic body 22, to connect the first to third surface electrodes 23 to 25 with each other while at least partially covering the first to third surface electrodes 23 to 25. A signal drawing electrode is formed by the connecting electrode 26 and the first to third surface electrodes 23 to 25. Similarly, another connecting electrode 30 is also formed on the lower surface of the piezoelectric ceramic body 22, to electrically connect the first to third surface electrodes 27 to 29 with each other. A lower signal drawing electrode is formed by the connecting electrode 30 and the surface electrodes 27 to 29.

Figure 1:
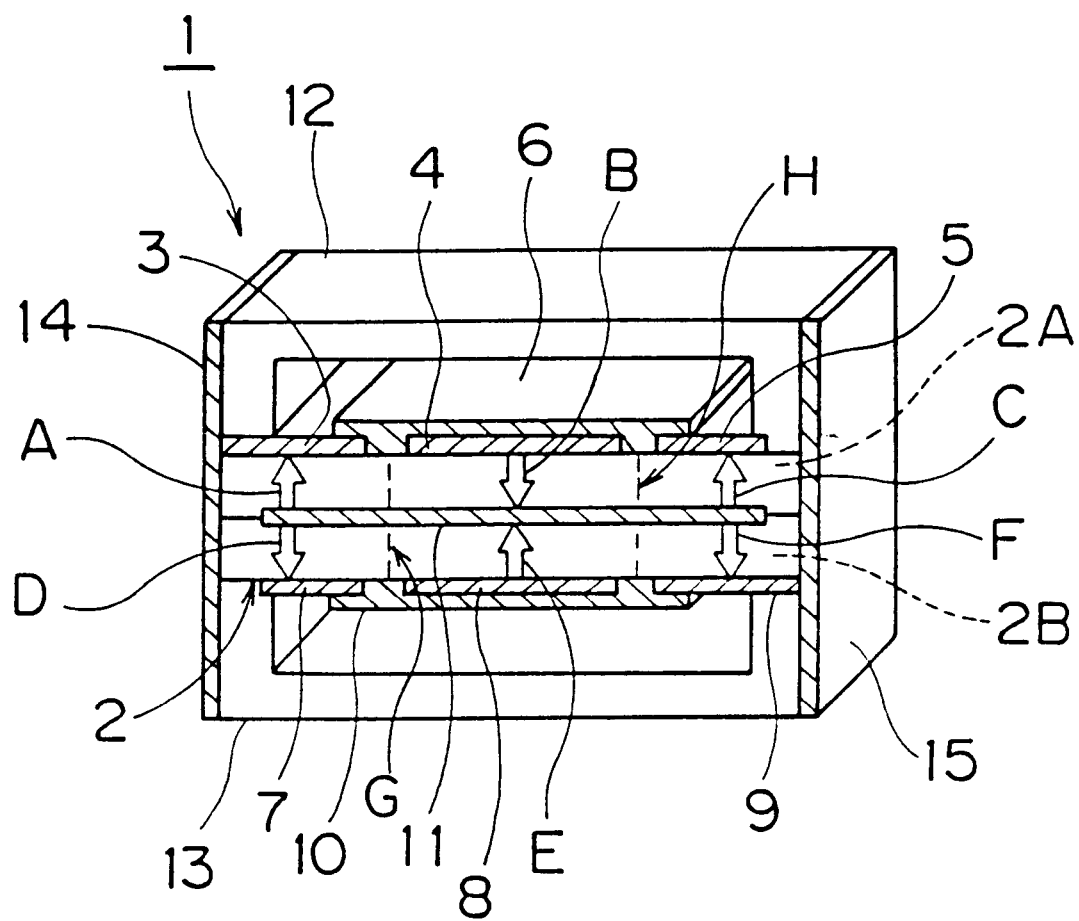
FIG. 1 is a perspective view schematically illustrating the structure of a conventional piezoelectric element.

Therefore, the connecting electrodes 26 and 30 have functions which are substantially similar to those of the connecting electrodes 6 and 10 provided in the piezoelectric element 1 shown in FIG. 1. According to this embodiment, however, the connecting electrodes 26 and 30 are formed as thin films by a thin film forming method such as sputtering, dissimilarly to the connecting electrodes 6 and 10 shown in FIG. 1.

In other points, the piezoelectric element 21 is similar to the piezoelectric element 1 shown in FIG. 1. Namely, the first to third surface electrodes 23 to 25 as well as 27 to 29 are formed in first to third portions along the longitudinal direction of the piezoelectric ceramic body 22 respectively. The first to third portions of the piezoelectric ceramic body 22 are divided by boundaries G and H. Namely, the first to third portions are located on the left side of the boundary G, between the boundaries G and H, and on the right side of the boundary H respectively. Further, a longitudinally internal electrode 31 is formed in the piezoelectric ceramic body 22. This internal electrode 31 is formed to extend in the longitudinal direction, but not to reach both longitudinal ends. Thus, the internal electrode 31 is not exposed on both end surfaces of the piezoelectric ceramic body 22. Further, the piezoelectric ceramic body 22 is polarized in the first to third portions, as shown by arrows A to C and D to F in FIG. 4. In addition, piezoelectric ceramic body regions 22A and 22B which are located above and under the internal electrode 11 respectively are polarized in opposite directions in each of the first to third portions. In each of the piezoelectric ceramic body regions 22A and 22B, further, the second portion and the first and third portions are polarized in opposite directions.

Frame bodies 32 and 33 are fixed to upper and lower portions of the piezoelectric ceramic body 22 respectively. These frame bodies 32 and 33 are made of insulating ceramics such as alumina or an insulating material such as synthetic resin. Each of the frame bodies 32 and 33 has a flat plate portion and a pair of fixed portions extending from both ends of the flat plate portion toward the piezoelectric ceramic body 22. Each of the frame bodies 32 and 33 is bonded to the upper or lower surface of the piezoelectric ceramic body 22 at the pair of fixed portions.

In the piezoelectric element 21, external electrodes 34 and 35 are formed on both side surfaces of a structural body which is formed by fixing the frame bodies 32 and 33 to the upper and lower portions of the piezoelectric ceramic body 22 respectively.

In the piezoelectric element 21, the signal drawing electrode which is formed on the upper surface of the piezoelectric ceramic body 2 is electrically connected with the external electrode 34 at the surface electrode 23. Similarly, the third surface electrode 29 is electrically connected with the external electrode 35 in the signal drawing electrode which is formed on the lower surface. In this case, the electrical connection states between the surface electrodes 32 and 29 and the external electrodes 34 and 35 are stably maintained since the surface electrodes 23 and 29 are formed by thick films as described above.

The piezoelectric element 21 can be applied to an acceleration sensor in the state shown in FIG. 4, for example, while the same can alternatively be mounted on a substrate (not shown) or a case (not shown) for forming a component which is provided in an acceleration sensor.

A method of manufacturing the piezoelectric element 21 shown in FIG. 4 is now described with reference to FIGS. 2A to 2C and 3A and 3B, which have been employed for illustrating the conventional method.

While reference numerals appearing in FIGS. 2A to 2C and 3A and 3B correspond to the respective parts of the piezoelectric element 1 shown in FIG. 1, the piezoelectric element 21 according to the embodiment shown in FIG. 4, which is similar in structure to the piezoelectric element 1 except the signal drawing electrodes, is described with reference to these figures.

In order to manufacture the piezoelectric element 21 according to this embodiment, a mother piezoelectric ceramic body is first prepared from piezoelectric ceramics such as lead zirconate titanate piezoelectric ceramics. This piezoelectric ceramic body is prepared similarly to the piezoelectric ceramic body 16 shown in FIG. 2A, so that a plurality of strip internal electrodes are formed therein. Such a piezoelectric ceramic body is obtained by a method of printing the internal electrodes on one surface of a mother green sheet, stacking another mother green sheet thereon and firing the same, or a method of forming the internal electrodes on a previously fired mother piezoelectric ceramic plate and pasting another fired piezoelectric ceramic plate thereto.

Further, conductive paste containing silver or silver-palladium alloy powder is prepared for forming first to third surface electrodes on upper and lower surfaces of the mother piezoelectric ceramic body by the conductive paste. The first to third surface electrodes are formed in the same positions as the first to third surface electrodes 3 to 5 and 7 to 9 of the conventional piezoelectric element 1 shown in FIG. 2B.

The surface electrodes of the conductive paste can be formed by applying the conductive paste, drying the same, and thereafter baking the same at a temperature of about 800° C. Thus, the first to third surface electrodes 23 to 25 and 27 to 29 of thick films having thicknesses of about 3 to 10 µm are formed in this embodiment. The lead zirconate titanate piezoelectric ceramics has a Curie point of about 300° C. However, no polarization is performed in advance of the step of forming the surface electrodes 23 to 25 and 27 to 29. Therefore, no depolarization is caused by such formation of the surface electrodes 23 to 25 and 27 to 29.

Then, the mother piezoelectric ceramic body is polarized through the internal electrodes and the first to third surface electrodes. In this case, the polarization can be performed by applying relatively high voltages, relatively low voltages, and intermediate voltages to the second surface electrodes provided in the second portions, the first and third surface electrodes provided in the first and third portions, and the internal electrodes respectively. Thus, the mother piezoelectric ceramic body can be polarized similarly to the piezoelectric ceramic body 16 shown in FIG. 2B, which is polarized as shown by arrows A to C and D to F.

Figure 2A:
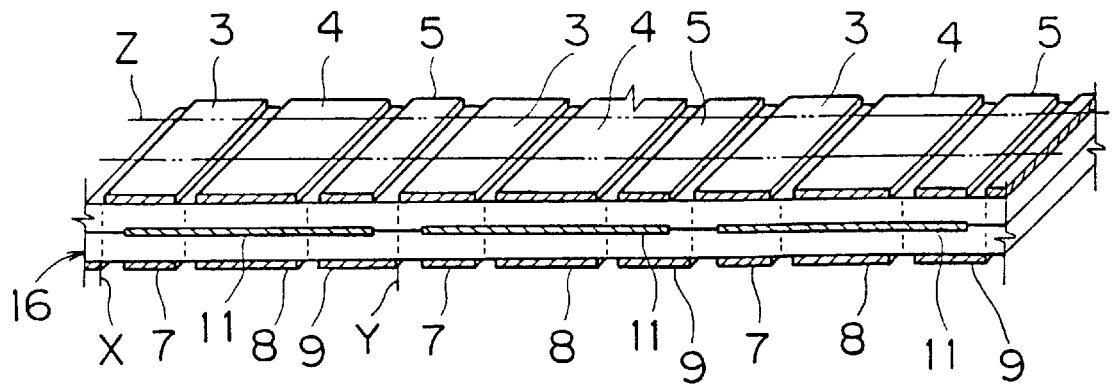
FIGS. 2A to 2C are perspective views for illustrating a method of manufacturing the conventional piezoelectric element, showing a mother piezoelectric ceramic body in a state provided with first to third surface electrodes on upper and lower surfaces respectively, in a polarized state, and in a state provided with connecting electrodes respectively.
Figure 2B:
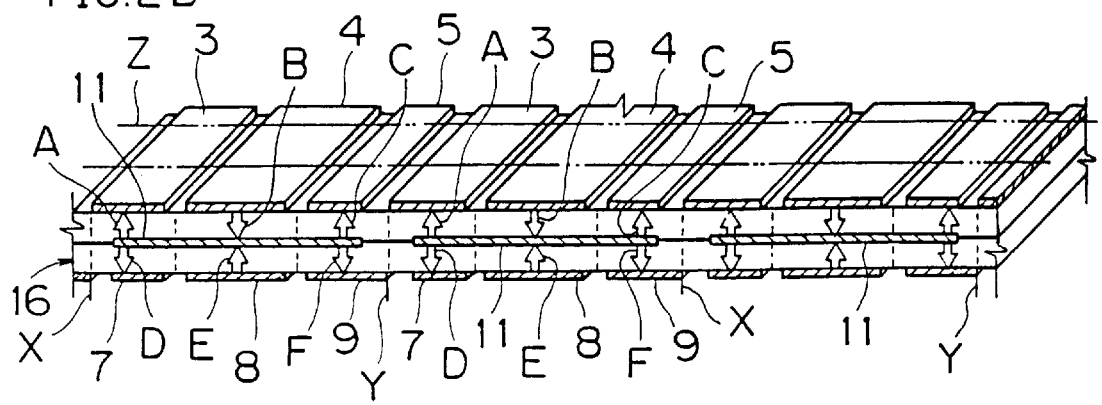
Figure 2C:
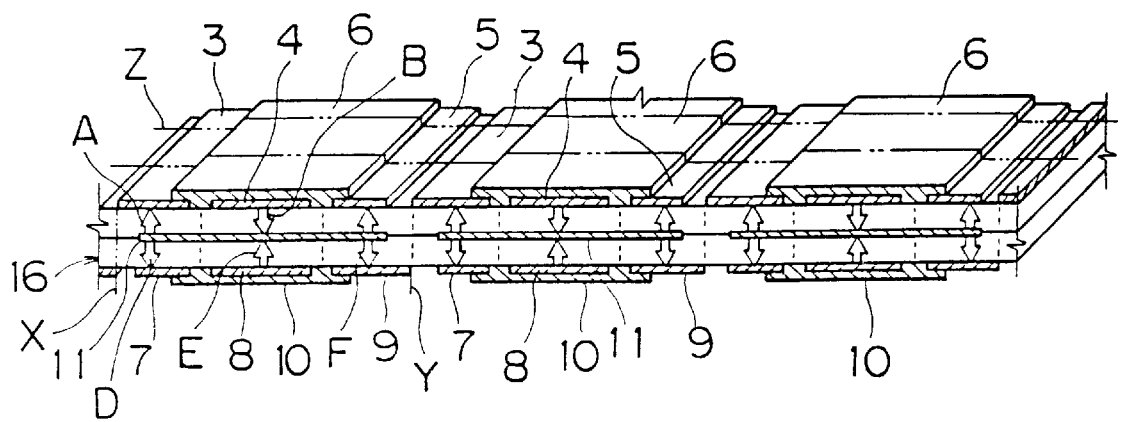
Figure 3A:
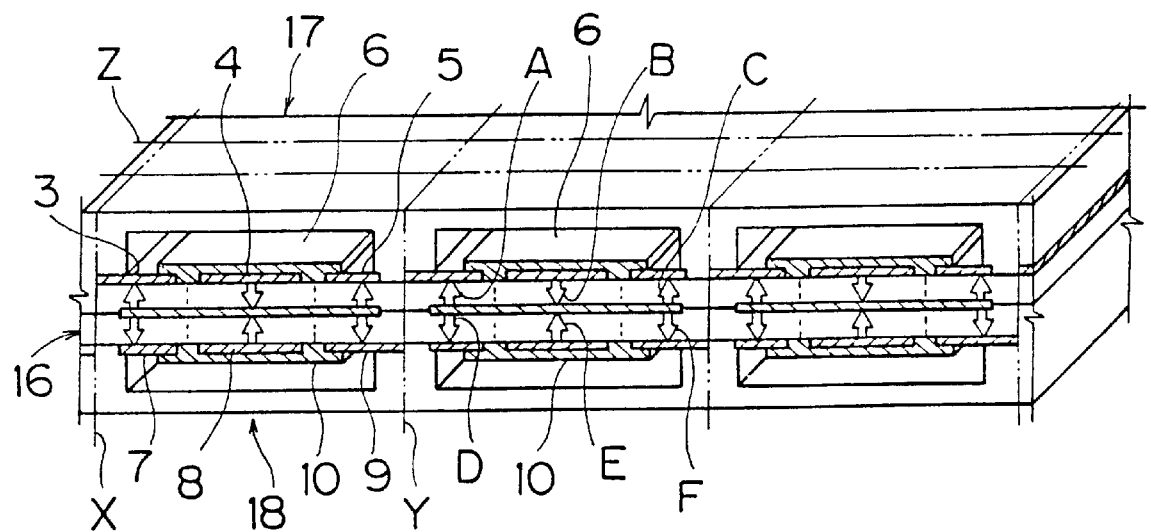
FIGS. 3A and 3B, which are adapted to illustrate the method of manufacturing the conventional piezoelectric element, are a perspective view showing a mother structural body, and a perspective view for illustrating the structure of an individual piezoelectric element obtained by cutting the mother structural body shown in FIG. 3A respectively.
Figure 3B:
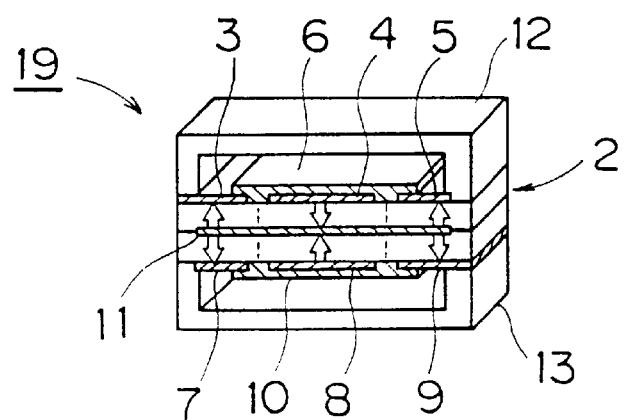

Then, connecting electrodes are formed on upper and lower surfaces of the mother piezoelectric ceramic body respectively in positions similar to those of the connecting electrodes 6 and 10 shown in FIG. 2C. According to this embodiment, however, the connecting electrodes are formed by sputtering. Namely, the connecting electrodes are formed by sputtering Monel, for example, on the upper and lower surfaces of the piezoelectric ceramic body, to cover the first to third surface electrodes. These connecting electrodes finally define the connecting electrodes 26 and 30 shown in FIG. 4.

The metal material for forming the connecting electrodes is not restricted to the Monel, which is a nickel-copper alloy, but may alternatively be prepared from nickel or silver. The temperature of the piezoelectric ceramic body is about 100 to 200° C. in the aforementioned sputtering. Thus, the temperature of the piezoelectric ceramic body in the sputtering is lower than the Curie point of the lead zirconate titanate piezoelectric ceramics forming the piezoelectric ceramic body, to result in no depolarization.

Then, after signal drawing electrodes are defined by forming the first to third surface electrodes and the connecting electrodes on the upper and lower surfaces of the mother piezoelectric ceramic body respectively in the aforementioned manner, mother frame bodies are fixed. The mother frame bodies can be prepared from those having the same structures as the frame bodies 17 and 18 shown in FIG. 3D. Further, structural bodies for individual piezoelectric elements can be obtained by cutting a mother structural body obtained in the aforementioned manner along lines corresponding to the phantom lines X, Y and Z shown in FIG. 3A. Each structural body obtained in this manner corresponds to a structure, which is not yet provided with the external electrodes 34 and 35, in the piezoelectric element 21 shown in FIG. 4.

Then, the piezoelectric element 21 can be obtained by forming the external electrodes 34 and 35 shown in FIG. 4 by a thin film forming method such as sputtering or plating.

In the piezoelectric element 21, the surface electrodes 23 and 29 consist of thick films, whereby electrical connection states between the surface electrodes 23 and 29 and the external electrodes 34 and 35 can be stabilized.

Figure 5A:
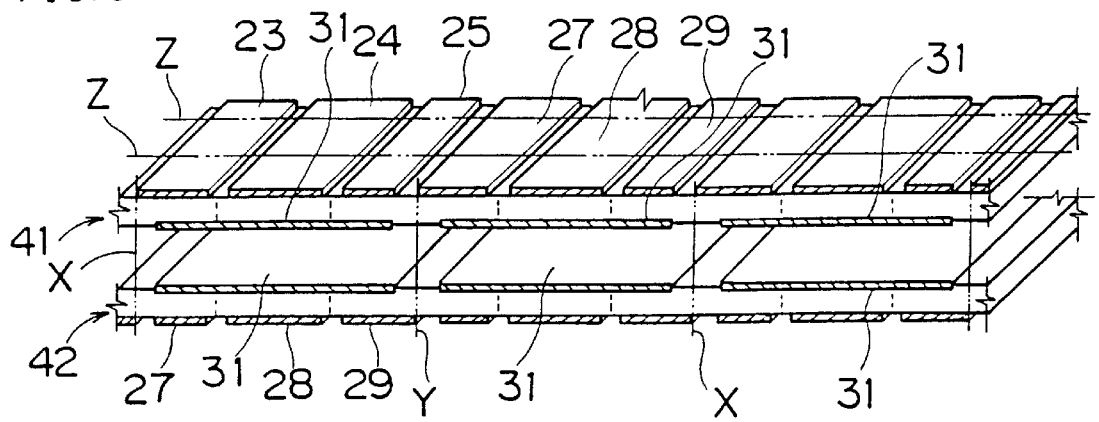
FIGS. 5A to 5C, which are adapted to illustrate another exemplary method of manufacturing the inventive piezoelectric element, are a perspective view showing a pair of piezoelectric substrates provided with internal electrodes and first to third surface electrodes respectively, an exploded perspective view showing the first and second piezoelectric substrates in polarized states, and a perspective view showing the first and second piezoelectric substrates provided with connecting electrodes.

While the rectangular plate type mother piezoelectric ceramic body having previously embedded internal electrodes is employed in the aforementioned method, the piezoelectric element 21 according to the first embodiment can also be manufactured by the following method:

First, a first mother piezoelectric ceramic plate 41 which is provided with a plurality of mother internal electrodes 31 on one surface and a second mother piezoelectric ceramic plate 42 which is also provided with mother internal electrodes 31 on one surface are prepared as shown in FIG. 5A. First to third surface electrodes 23 to 25 and 27 to 29 are formed by conductive paste containing silver or silver-palladium on surfaces of the piezoelectric ceramic plates 41 and 42 which are opposite to those provided with the internal electrodes 31 respectively. These surface electrodes 23 to 25 and 27 to 29 are formed by printing and baking the conductive paste, while the conductive paste is baked by heating the same to a temperature of about 800° C., similarly to the aforementioned method.

The first to third surface electrodes 23 to 25 and 27 to 29 are formed in portions corresponding to first to third portions of piezoelectric ceramic bodies for forming individual piezoelectric elements respectively.

Figure 5B:
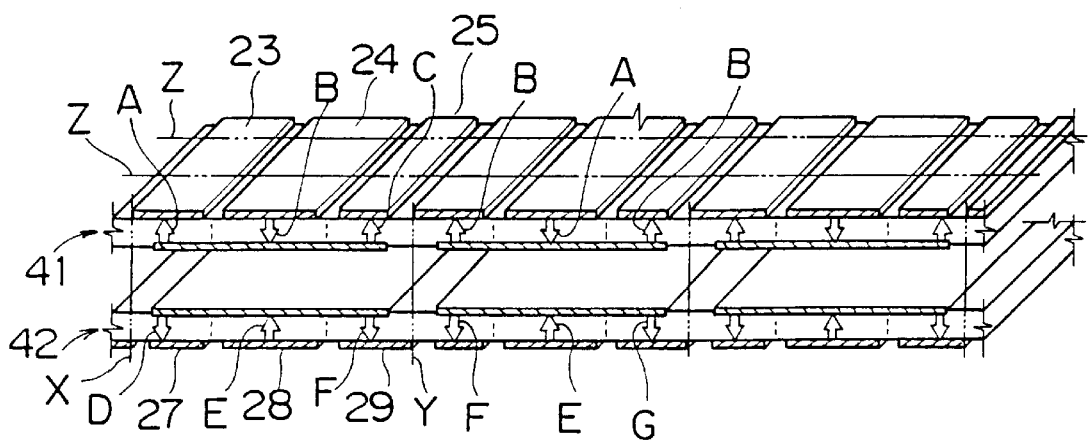
Figure 5C:
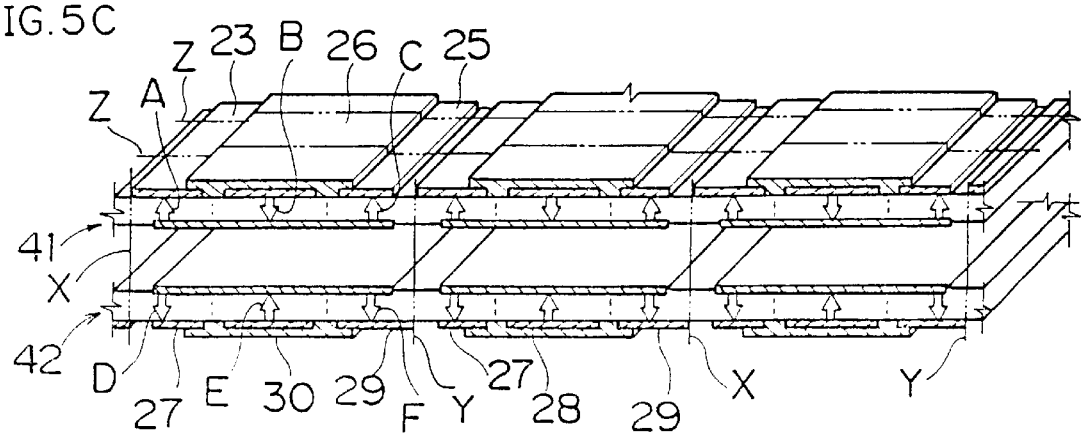

Then, the internal electrodes 31 and the surface electrodes 23 to 25 and 27 to 29 are employed to polarize the first and second piezoelectric ceramic plates 41 and 42 respectively. This polarization is performed by applying relatively high voltages, relatively low voltages, and intermediate voltages to the second surface electrodes 24, the first and third surface electrodes 23 and 25, and the internal electrodes 31 in the piezoelectric ceramic plate 41 respectively as shown in FIG. 5B, whereby the second portions are polarized along arrows B and the first and third portions are polarized along arrows A and C respectively in the piezoelectric ceramic plate 41. Similarly, the second portions are polarized along arrows E and the first and third portions are polarized along arrows F and G respectively in the second ceramic plate 42.

Then, connecting electrodes 26 and 30 are formed by sputtering.

Thereafter the first and second mother piezoelectric plates 41 and 42 are pasted to each other so that the internal electrodes 31 thereof overlap with each other. The mother ceramic plates 41 and 42 can be pasted to each other through an adhesive to obtain a structure which is similar to that of the piezoelectric element 21 according to the embodiment shown in FIG. 4, and the piezoelectric element 21 can be obtained by forming the external electrodes 34 and 35 (see FIG. 4) by a proper method.

In the piezoelectric element 21 according to the first embodiment, as hereinabove described, the first to third surface electrodes 23 to 25 and 27 to 29 are formed by thick films, whereby electrical connection between the external electrodes 34 and 35 and the first and third surface electrodes 23 and 29 can be ensured. In the manufacturing steps, further, the polarization is performed after formation of the first to third surface electrodes 23 to 25 and 27 to 29 consisting of thick films in advance of formation of the connecting electrodes 26 and 30 which are in the form of thin films. Therefore, the piezoelectric body is not heated to a temperature exceeding the Curie point after the polarization, to result in no depolarization.

Figure 6:
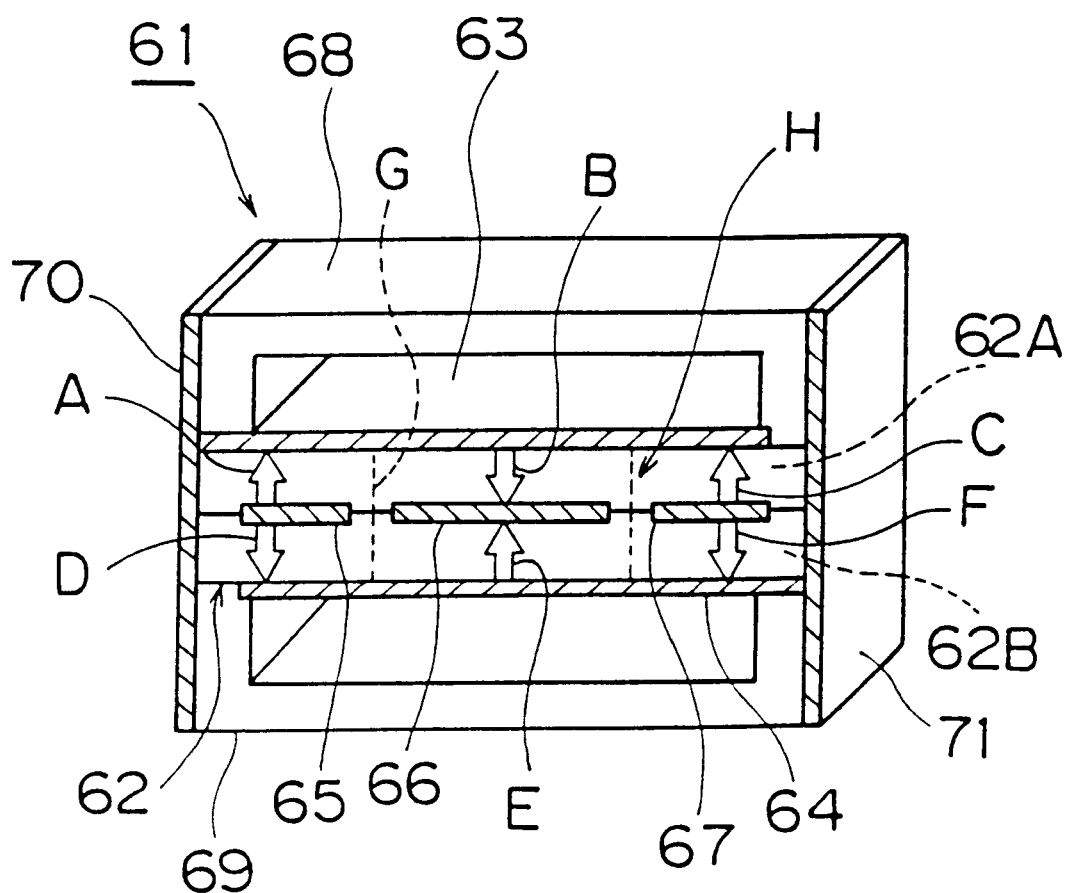
FIG. 6 is a perspective view showing a piezoelectric element according to a second embodiment of the present invention.

FIG. 6 is a perspective view showing a piezoelectric element 61 according to a second embodiment of the present invention.

The piezoelectric element 61 has a piezoelectric ceramic body 62 serving as a piezoelectric body. First and second signal drawing electrodes 63 and 64 are formed on upper and lower surfaces of the piezoelectric ceramic body 62 respectively. The first signal drawing electrode 63 is so formed that one end thereof reaches one side edge of the piezoelectric ceramic body 62, while the second signal drawing electrode 64 is drawn out to a side edge which is opposite to that drawing out the signal drawing electrode 63.

In the interior of the piezoelectric ceramic body 62, first to third internal electrodes 65, 66 and 67 are formed on an intermediate vertical position. The first to third internal electrodes 65 to 67 are formed in first to third portions along the longitudinal direction of the piezoelectric ceramic body 62 respectively.

The first to third portions are divided by boundaries shown by broken lines G and H respectively. In other words, the first, second and third portions of the piezoelectric ceramic body 62 are located on the left side of the boundary G, between the boundaries G and H, and on the right side of the boundary H respectively.

The piezoelectric ceramic body 62 is polarized as shown by arrows A to F in FIG. 6. In a piezoelectric ceramic body region 62A of the piezoelectric ceramic body 62 which is located above the portion provided with the internal electrodes 65 to 67, the second portion is polarized along arrow B, while the first and third portions are polarized along arrows A and C respectively, oppositely to the second portion. Similarly in a piezoelectric body region 62B which is located under the portion provided with the internal electrodes 65 to 67, the second portion is polarized along arrow E, while the first and third portions are polarized along arrows D and F respectively, oppositely to the second portion. Namely, the second portion and the first and third portions are polarized in opposite directions in each of the piezoelectric ceramic body regions 62A and 62B. In each of the first to third portions, further, the upper and lower piezoelectric ceramic body regions 62A and 62B are polarized in opposite directions.

The piezoelectric ceramic body 62 is polarized through the first and second signal drawing electrodes 63 and 64 and the first to third internal electrodes 65 to 67. As clearly understood from a manufacturing method described later, relatively high voltages, a relatively low voltage, and intermediate voltages are applied to the first and third internal electrodes 65 and 67, the second internal electrode 66, and the first and second signal drawing electrodes 63 and 64 respectively, whereby the piezoelectric ceramic body 62 is polarized along arrows A to F in FIG. 6. Since the first to third internal electrodes 65 to 67 are formed on the intermediate vertical position of the piezoelectric ceramic body 62 and the first and second signal drawing electrodes 63 and 64 are formed on the upper and lower surfaces thereof respectively, the piezoelectric ceramic body 62 can be polarized in the aforementioned manner after formation of these electrodes 63 to 67. Thus, no depolarization results from formation of the electrodes 63 to 67, which can be formed on the piezoelectric ceramic body 62 in advance of the polarization.

Frame bodies 68 and 69 are fixed to the upper and lower surfaces of the piezoelectric ceramic body 62 respectively. Each of the frame bodies 68 and 69 is made of insulating ceramics or synthetic resin, and has a flat plate portion and a pair of fixed portions which are provided on both ends of the flat plate portion. The frame bodies 68 and 69 are fixed to the piezoelectric ceramic body 62 at the pairs of fixed portions respectively by adhesives or the like.

In the piezoelectric element 61 according to this embodiment, external electrodes 70 and 71 are formed on a pair of side surfaces of a structural body which is formed by bonding the frame bodies 68 and 69 to the piezoelectric ceramic body 62. The external electrodes 70 and 71 can be formed by a proper electrode forming method. These external electrodes 70 and 71 are electrically connected to the first and second signal drawing electrodes 63 and 64 respectively.

The first and second signal drawing electrodes 63 and 64 are formed by applying and baking conductive paste, as thick films. Thus, electrical connection states between the first and second signal drawing electrodes 63 and 64 and the external electrodes 70 and 71 are stably maintained.

Only the first and second signal drawing electrodes 63 and 64 consisting of single layers are formed on the upper and lower surfaces of the piezoelectric ceramic body 62.

Therefore, a step of forming electrodes on the upper and lower surfaces of the piezoelectric ceramic body 62 can be simplified as compared with the first embodiment.

An exemplary method of manufacturing the piezoelectric element 61 is now described with reference to FIGS. 7A to 7C and 8A and 8B.

The following description is made on steps of obtaining individual piezoelectric elements 61 from a mother structural body.

Figure 7A:
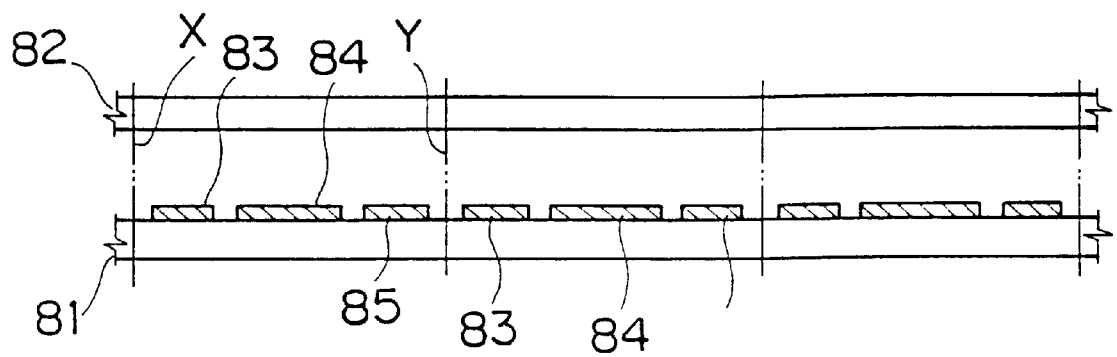
FIGS. 7A to 7C, which are adapted to illustrate a method of manufacturing the piezoelectric element according to the second embodiment, are side elevational views showing first and second piezoelectric bodies in states provided with first to third internal electrode patterns, a laminate obtained by stacking the first and second piezoelectric bodies with each other, and the laminate provided with first and second signal drawing electrodes on its upper and lower surfaces respectively.

First, mother green sheets 81 and 82 for forming the piezoelectric ceramic body 62 are prepared as shown in FIG. 7A. The green sheets 81 and 82 are mainly made of lead zirconate titanate piezoelectric ceramic powder respectively. These green sheets 81 and 82, which are prepared for forming a number of piezoelectric ceramic bodies 62 respectively, have shapes and sizes gathering the piezoelectric ceramic bodies 62 in the form of matrices. It is pointed out that a region corresponding to a single piezoelectric ceramic body 62 corresponds to a portion enclosed with phantom lines X and Y in FIG. 7A.

Conductive paste containing silver or silver-palladium alloy powder is applied to an upper surface of the green sheet 81 by screen printing or the like and dried at a temperature of about 100° C., thereby forming first to third internal electrode patterns 83 to 85. The internal electrode patterns 83 to 85 extend in the form of strips, perpendicularly to the plane of the figure.

Figure 7B:
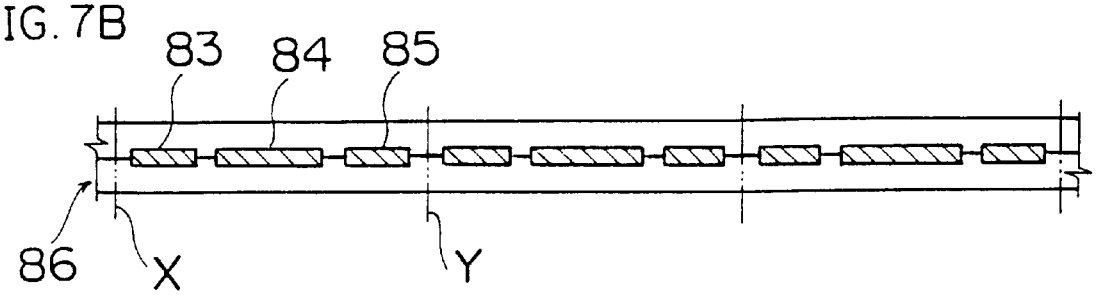

Then, the green sheet 82 is stacked on the green sheet 81 as shown in FIG. 7B, and fired at a temperature of about 1000° C. Due to this firing, the green sheets 81 and 82 are integrated with each other, to form a mother piezoelectric ceramic body 86. At the same time, the internal electrode patterns 83 to 85 are baked to form mother internal electrodes 83 to 85 (these reference numerals are identical to those for the internal electrode patterns).

Figure 7C:
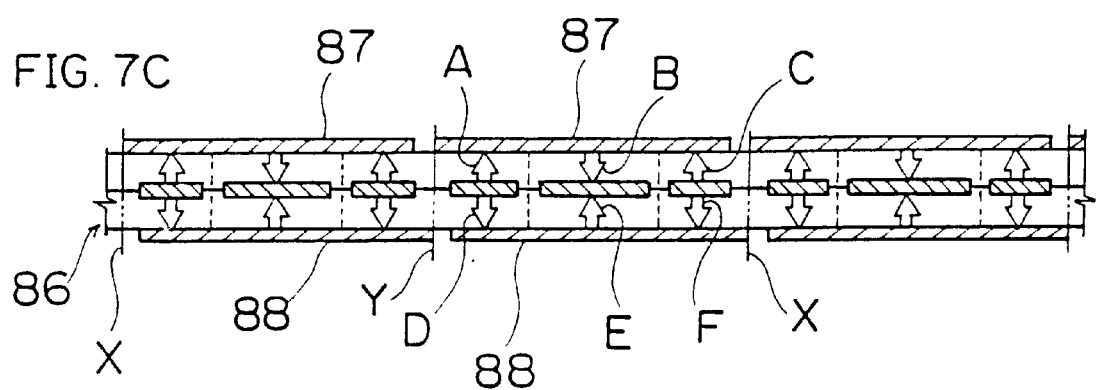

Then, first and second mother signal drawing electrodes 87 and 88 are formed on upper and lower surfaces of the mother piezoelectric ceramic body 86 respectively, as shown in FIG. 7C. The first and second signal drawing electrodes 87 and 88 are formed by applying conductive paste containing silver or silver-palladium alloy powder by screen printing or the like, drying the same at a temperature of about 100° C., and further baking the same at a temperature of about 800° C.

Then, the mother piezoelectric ceramic body 86 is polarized. This polarization is carried out by applying relatively high voltages, relatively low voltages, and intermediate voltages to the mother internal electrodes 83 and 85, the mother internal electrodes 84, and the first and second signal drawing electrodes 87 and 88 respectively. Consequently, the piezoelectric ceramic body 86 is polarized as shown by arrows A to F in FIG. 7C. Namely, longitudinally extending first to third portions of the piezoelectric ceramic body 86 are polarized similarly to the piezoelectric ceramic body 62 shown in FIG. 6 in the portions enclosed with the phantom lines X and Y.

Figure 8A:
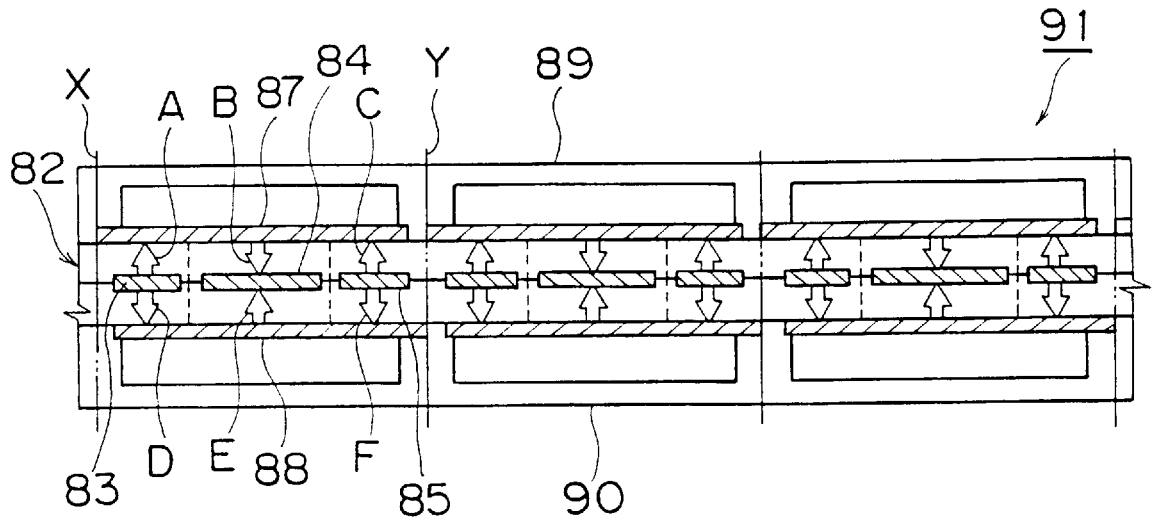
FIGS. 8A and 8B, which are adapted to illustrate the method of manufacturing the piezoelectric element according to the second embodiment, are a side elevational view showing mother frame bodies which are fixed to the piezoelectric ceramic bodies, and a structural body for an individual piezoelectric element which is cut out from a mother structural body.

Then, mother frame bodies 89 and 90 are fixed to upper and lower portions of the mother piezoelectric ceramic body 86 respectively, as shown in FIG. 8A. The mother frame bodies 89 and 90 are made of insulating ceramics such as alumina or synthetic resin. These mother frame bodies 89 and 90 are fixed to the mother piezoelectric ceramic body 86 through adhesives or the like.

Figure 8B:
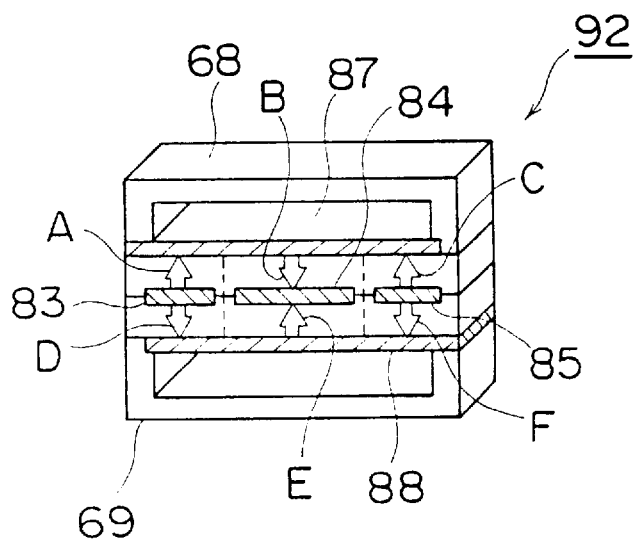

Then, a mother laminate 91 shown in FIG. 8A is cut along the phantom lines X and Y in FIG. 8A in its thickness direction, whereby a laminate 92 for an individual piezoelectric element shown in FIG. 8B can be obtained. In the laminate 92 for the individual piezoelectric element, the aforementioned mother piezoelectric ceramic body 86 is cut into the piezoelectric ceramic body 62. Similarly, the mother internal electrodes 83 to 85 are cut into the first to third internal electrodes 65 to 67 respectively, while the first and second mother signal drawing electrodes 87 and 88 are cut into the first and second signal drawing electrodes 63 and 64 respectively. In addition, the mother frame bodies 89 and 90 are cut into the frame bodies 68 and 69 respectively.

The piezoelectric element 61 shown in FIG. 6 can be obtained by forming the external electrodes 70 and 71 on a pair of side surfaces of the aforementioned laminate 92 respectively.

The piezoelectric element 61 obtained in the aforementioned manner can be employed as an acceleration sensor, for example, similarly to the first embodiment. Namely, the piezoelectric element 61 can be applied to an acceleration sensor as such, while it is alternatively possible to form the piezoelectric element 61 as an acceleration sensor component by mounting the same on a proper substrate or storing the same in a case.

Another exemplary method of manufacturing the piezoelectric element 61 is now described with reference to FIGS. 9A to 9C.

Figure 9A:
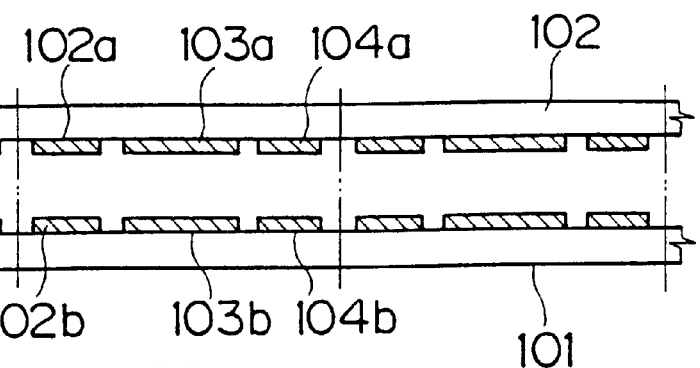
FIGS. 9A to 9C, which are adapted to illustrate another method of manufacturing the piezoelectric element according to the second embodiment, are an exploded perspective view for illustrating fired first and second piezoelectric ceramic plates which are provided with first to third internal electrodes on single surfaces, a side elevational view showing the first and second piezoelectric ceramic plates which are provided with signal drawing electrodes and polarized, and a side elevational view showing the first and second piezoelectric ceramic plates which are pasted to each other.

The piezoelectric element 61 can be manufactured not only by the aforementioned method, but by the following method:

Previously fired mother piezoelectric ceramic plates 101 and 102 which are in the form of rectangular plates are first prepared as shown in FIG. 9A. Then, first to third mother internal electrode patterns 102a to 104a and 102b to 104b are formed on single major surfaces of the piezoelectric ceramic plates 101 and 102 respectively. These mother internal electrode patterns 102a to 104a and 102b to 104b are formed by applying conductive paste containing silver or silver-palladium alloy powder by screen printing or the like and drying the same.

Figure 9B:
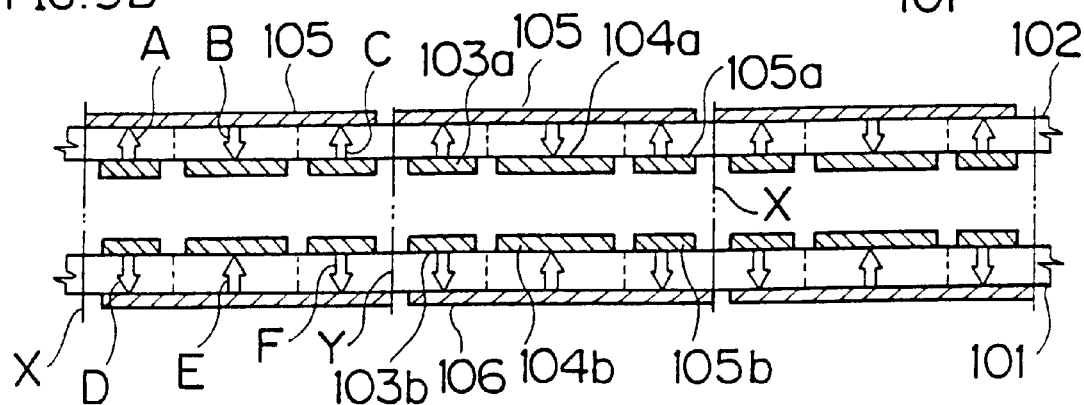

Then, first and second mother signal drawing electrode patterns 105 and 106 are formed on other surfaces of the piezoelectric ceramic plates 101 and 102 respectively, as shown in FIG. 9B. The first and second signal drawing electrode patterns 105 and 106 are formed by applying conductive paste and drying the same, similarly to the above. Then, the internal electrode patterns 102a to 104b and the signal drawing electrode patterns 105 and 106 are baked by heating, to be completed as electrodes respectively.

Further, the first piezoelectric ceramic plate 101 is polarized along arrows D to F in FIG. 9B. This polarization is carried out by applying relatively high voltages, relatively low voltages, and intermediate voltages to the internal electrode patterns 102b and 104b provided on the upper surface, the internal electrode patterns 103b, and the second signal drawing electrodes 106 respectively. The piezoelectric ceramic body 102 is also polarized along arrows A to C in FIG. 9B.

After the polarization, the piezoelectric ceramic plates 101 and 102 are pasted to each other through thermosetting adhesives, so that the internal electrode patterns 102a, 104a, 102b and 104b overlap with each other.

Figure 9C:
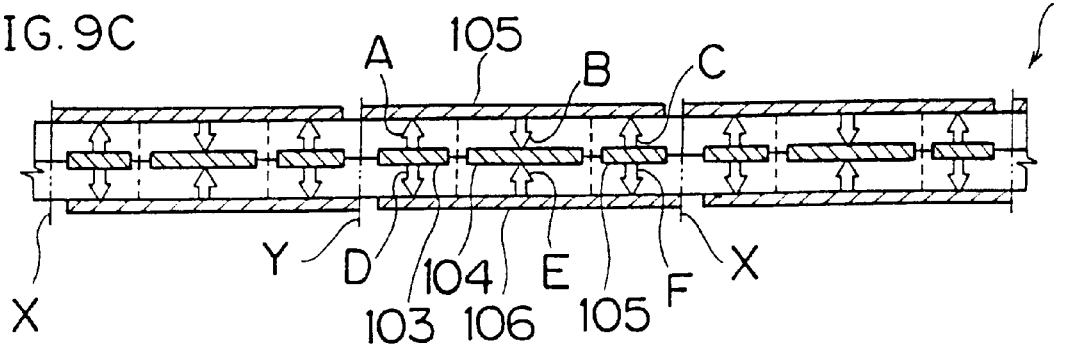

Thus, a mother piezoelectric ceramic body 107 is obtained as shown in FIG. 9C. This mother piezoelectric ceramic body 107 is similar in structure to the mother piezoelectric ceramic body 86 shown in FIG. 7C. Therefore, subsequent steps can be carried out along those described above with reference to FIGS. 8A and 8B, whereby the piezoelectric element 61 shown in FIG. 6 can be obtained in a similar manner to the above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a piezoelectric element, comprising the steps of:

preparing a piezoelectric body including an internal electrode arranged to extend along a longitudinal direction of the piezoelectric body;

applying conductive paste to upper and lower surfaces of said piezoelectric body in first, second and third portions of each of said upper and lower surfaces along said longitudinal direction and baking the conductive paste, thereby forming first, second and third surface electrodes on each of said upper and lower surfaces, respectively;

polarizing said piezoelectric body through said internal electrode and said first, second and third surface electrodes located on said upper and lower surfaces of said piezoelectric body so that said first and third portions and said second portion of said piezoelectric body are oppositely polarized along a thickness direction of said piezoelectric body; and forming first and second connecting electrodes for electrically connecting said first, second and third surface electrodes located on said upper and lower surfaces of said piezoelectric body with each other, respectively, so that the first and second connecting electrodes at least partially cover said first, second and third surface electrodes, respectively.

2. The method of manufacturing a piezoelectric element in accordance with claim 1, wherein regions being located above and under said internal electrode are polarized in opposite directions in each of said first to third portions.

3. The method of manufacturing a piezoelectric element in accordance with claim 1, wherein said step of preparing said plate type piezoelectric body being provided with said internal electrode is carried out by pasting a pair of piezoelectric ceramic plates to each other through interposition of said internal electrode therebetween.

4. A method of manufacturing a piezoelectric element, comprising the steps of:

preparing a pair of piezoelectric ceramic plates each having two major surfaces;

forming a plurality of internal electrodes on a first major surface of each of said piezoelectric plates so that each of the internal electrodes extends in a longitudinal direction of the respective piezoelectric plate without extending to longitudinal ends of the piezoelectric plate;

forming, on the second manor surface of each of said piezoelectric plates, a plurality of sets of surface electrodes, each set of surface electrodes being disposed opposite to a corresponding one said internal electrodes and comprising a first, second and third surface electrode which are disposed in respective first, second and third portions of said piezoelectric ceramic plate extending along longitudinal directions of said piezoelectric ceramic plate, said surface electrodes being made of relatively thick films which are formed by applying and baking conductive paste;

polarizing said piezoelectric ceramic plates each provided with said internal electrodes and said first, second and third surface electrodes so that said first and third portions and are polarized in a direction opposite to a polarization direction of said second portions along thickness directions through said internal electrodes and said first, second and third surface electrodes, respectively;

forming connecting electrodes including relatively thin films on said surfaces of said piezoelectric ceramic plates provided with said first, second and third surface electrodes, to electrically connect said first, second and third surface electrodes with each other and to at least partially cover said first, second and third surface electrodes, respectively; and adhering to each other said surfaces provided with said internal electrodes, of said pair of piezoelectric ceramic plates provided with said connecting electrodes, thereby forming a piezoelectric body.

5. The method of manufacturing a piezoelectric element in accordance with claim 4, wherein regions being located above and under each said internal electrode are polarized in opposite directions in each of said first to third portions.

6. A method of manufacturing a piezoelectric element, comprising the steps of:

preparing rectangular plate shaped first and second green sheets containing piezoelectric ceramics;

applying conductive paste to a single surface of said first green sheet in first to third portions along its longitudinal direction, for forming first to third internal electrode patterns respectively;

stacking said second green sheet on said surface of said first green sheet being provided with said first to third internal electrode patterns, for obtaining a laminate sheet;

firing said laminate sheet thereby integrally firing said ceramics and said first to third internal electrodes for obtaining a sintered body;

forming first and second signal drawing electrodes by applying conductive paste to upper and lower surfaces of said sintered body and baking the same; and polarizing said sintered body through said first and second signal drawing electrodes and said first to third internal electrodes so that said first and third portions and said second portion of said sintered body along its longitudinal direction are oppositely polarized along its thickness direction.

7. The method of manufacturing a piezoelectric element in accordance with claim 6, wherein regions being located above and under each said internal electrode are polarized in opposite directions in each of said first to third portions.

8. A method of manufacturing a piezoelectric element, comprising the steps of:

preparing fired rectangular first and second piezoelectric ceramic plates;

applying conductive paste to first to third portions along longitudinal directions on single surfaces of said first and second piezoelectric ceramic plates thereby forming first to third internal electrode patterns respectively;

applying conductive paste to surfaces of said first and second piezoelectric ceramic plates being opposite to those provided with said internal electrode patterns, for forming first and second signal drawing electrode patterns respectively;

heating said first and second piezoelectric ceramic plates thereby baking said internal electrode patterns and said signal drawing electrode patterns, for forming first to third internal electrodes and signal drawing electrodes respectively;

polarizing said first and second piezoelectric ceramic plates through said signal drawing electrodes and said first to third internal electrodes so that said first and third portions and said second portions of said piezoelectric ceramic plates are oppositely polarized in thickness directions; and pasting said surfaces, being provided with said internal electrodes, of said first and second piezoelectric ceramic plates being provided with said first to third internal electrodes to each other, thereby obtaining a piezoelectric element.

9. The method of manufacturing a piezoelectric element in accordance with claim 8, wherein regions being located above and under each said internal electrode are polarized in opposite directions in each of said first to third portions.

* * * * *